(12) United States Patent
Park et al.

(10) Patent No.: US 11,679,447 B2
(45) Date of Patent: Jun. 20, 2023

(54) APPARATUS AND METHOD FOR TREATING SUBSTRATE

(71) Applicant: SEMES CO., LTD., Chungcheongnam-do (KR)

(72) Inventors: Soo Young Park, Incheon (KR); Ohyeol Kwon, Chungcheongnam-do (KR); Jun Keon Ahn, Sejong-si (KR); Jung Hwan Lee, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 317 days.

(21) Appl. No.: 16/861,709

(22) Filed: Apr. 29, 2020

(65) Prior Publication Data

US 2020/0346299 A1 Nov. 5, 2020

(30) Foreign Application Priority Data

Apr. 30, 2019 (KR) .................. 10-2019-0050336

(51) Int. Cl.
*B23K 26/042* (2014.01)
*B23K 26/03* (2006.01)
(Continued)

(52) U.S. Cl.
CPC .......... *B23K 26/042* (2015.10); *B23K 26/032* (2013.01); *B23K 26/0823* (2013.01);
(Continued)

(58) Field of Classification Search
CPC ............... B23K 26/042; B23K 26/032; B23K 26/0823; H01L 22/12; H01L 21/02021
See application file for complete search history.

(56) References Cited

U.S. PATENT DOCUMENTS 5,060,043 A * 10/1991 Yasue ................... H01L 23/544
257/E29.022
7,479,236 B2 * 1/2009 Chen ................ G05B 19/41875
700/121

(Continued)

FOREIGN PATENT DOCUMENTS

CN 102069297 A 5/2011
CN 102338990 A 2/2012
(Continued)

OTHER PUBLICATIONS

Office Action for related Korean Patent Application No. 10-2019-0050336 dated Jun. 29, 2020 (4 pages).
(Continued)

*Primary Examiner* — Ibrahime A Abraham
*Assistant Examiner* — Franklin Jefferson Wang
(74) *Attorney, Agent, or Firm* — Procopio, Cory, Hargreaves & Savitch LLP

(57) ABSTRACT

Disclosed is a substrate treating apparatus. The substrate treating apparatus includes a chamber providing a space in which a substrate is treated, a support unit supporting the substrate inside the chamber, a laser unit irradiating laser to an edge region of the substrate, a vision unit capturing the edge region of the substrate to measure an offset value of the substrate, and an adjustment unit adjusting an irradiation location of the laser based on the offset value of the substrate.

7 Claims, 6 Drawing Sheets

(51) Int. Cl.
*B23K 26/08* (2014.01)
*H01L 21/02* (2006.01)
*H01L 21/68* (2006.01)
*H01L 21/66* (2006.01)

(52) U.S. Cl.
CPC ...... *H01L 21/02021* (2013.01); *H01L 21/681* (2013.01); *H01L 22/12* (2013.01)

(56) References Cited

U.S. PATENT DOCUMENTS

| | | | | |
|---|---|---|---|---|
| 2002/0050489 | A1 | 5/2002 | Ikegami et al. | |
| 2010/0133243 | A1* | 6/2010 | Nomaru | B23K 26/032 219/121.67 |
| 2011/0108533 | A1* | 5/2011 | Boettcher | B23K 26/1476 219/121.72 |
| 2012/0013730 | A1* | 1/2012 | Koga | H01L 21/67288 348/87 |
| 2016/0158888 | A1* | 6/2016 | Liu | G02B 7/04 359/809 |
| 2018/0076043 | A1* | 3/2018 | Ito | H01L 21/02021 |
| 2019/0348272 | A1* | 11/2019 | Ecker | C30B 23/025 |
| 2020/0276630 | A1* | 9/2020 | Kikuchi | B21D 39/00 |

FOREIGN PATENT DOCUMENTS

| | | | |
|---|---|---|---|
| CN | 109277695 | A | 1/2019 |
| CN | 109530912 | A | 3/2019 |
| JP | 2003197570 | A * | 7/2003 |
| JP | 2009195947 | A * | 9/2009 |
| JP | 2012023289 | A | 2/2012 |
| JP | 2013107090 | A | 6/2013 |
| JP | 2013107090 | A * | 6/2013 |
| JP | 2016115893 | A | 6/2016 |
| JP | 2010505277 | A | 2/2018 |
| JP | 2018043340 | A | 3/2018 |
| KR | 20120008447 | A | 1/2012 |
| KR | 10-2016-0021405 | A | 2/2016 |
| KR | 10-1605698 | B1 | 3/2016 |
| KR | 101607842 | B1 * | 3/2016 |
| KR | 10-2016-0122647 | A | 10/2016 |
| KR | 10-2019-0003346 | A | 1/2019 |
| KR | 10-2019-0014615 | A | 2/2019 |

OTHER PUBLICATIONS

Notice of Allowance for related Korean Patent Application No. 10-2019-0050336 dated Oct. 22, 2020 (5 pages).

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0050336 filed on Apr. 30, 2019, in the Korean Intellectual Property Office, the entire contents of which are hereby incorporated by reference.

BACKGROUND

Embodiments of the inventive concept described herein relate to a substrate treating apparatus and a substrate treating method, and more particularly, relate to a substrate treating apparatus and a substrate treating method for etching an edge region of a substrate.

To manufacture a semiconductor device or a liquid crystal display, various processes such as photolithography, etching, ashing, ion implantation, thin film deposition, and cleaning are performed on a substrate. The etching process thereof is a process of removing unnecessary regions from the thin film formed on the substrate and requires a high selectivity and high etch rate for the thin film.

In the related art, while the substrate is rotated to etch the substrate, the amount of light reflected from the substrate is measured to calculate the edge region of the substrate, and then, the calculated edge region of the substrate is irradiated with laser or treated chemically to perform the etching process on the edge region of the substrate. However, after the edge region of the substrate is calculated, the substrate is again placed on the electrostatic chuck of the substrate to perform the etching process, thereby increasing a treatment time, and even though there are minute differences in the diameter of the substrate processed in the chamber, it is difficult to correct the minute differences.

SUMMARY

Embodiments of the inventive concept provide a substrate treating apparatus and a substrate treating method that may measure the eccentricity of a substrate and may adjust the irradiation location of the laser by using a vision unit coaxially formed as the laser.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a substrate treating apparatus includes a chamber providing a space in which a substrate is treated, a support unit supporting the substrate inside the chamber, a laser unit irradiating laser to an edge region of the substrate, a vision unit capturing the edge region of the substrate to measure an offset value of the substrate, and an adjustment unit adjusting an irradiation location of the laser based on the offset value of the substrate.

Herein, the adjustment unit may include a body, a light reflection unit provided inside the body and coaxially changing an irradiation direction of the laser and an imaging direction of the vision unit, and a controller adjusting the irradiation location of the laser by driving the body.

Herein, the controller may change the irradiation location of the laser by adjusting a slope of the body.

Herein, the controller may calculate a shortest distance between a predetermined reference point and an end of the substrate as the offset value of the substrate in an image captured by the vision unit and may adjust the slope of the body based on the offset value and a distance between the body and the substrate.

Furthermore, the controller may change the irradiation location of the laser by changing a location of the body.

Herein, the controller may move the location of the body by a distance corresponding to the offset value of the substrate.

Moreover, the support unit may include a spin head for rotating the substrate, and the adjustment unit may be synchronously controlled together with the spin head based on the offset value of the substrate.

Herein, the adjustment unit may generate a profile for the offset value corresponding to a spin angle of the substrate and may adjust the irradiation location of the laser depending on the profile.

According to an exemplary embodiment, a substrate treating method for irradiating laser to an edge region of a substrate by using a substrate treating apparatus according to an embodiment of the inventive concept may include capturing the edge region of the substrate while the substrate is rotated, generating a profile for an offset value of the substrate according to a spin angle of the substrate in the edge region of the substrate, adjusting an irradiation location of the laser based on the profile for the offset value of the substrate, and irradiating the laser to treat the substrate.

Herein, the adjusting of the irradiation location of the laser may include changing the irradiation location of the laser by adjusting a slope of the adjustment unit.

Herein, the generating of the profile for the offset value of the substrate may include calculating a shortest distance between a predetermined reference point and an end of the substrate as the offset value of the substrate in an image captured by the vision unit. The changing of the irradiation location of the laser may include adjusting the slope of the adjustment unit based on the offset value and a distance between the adjustment unit and the substrate.

Furthermore, the adjusting of the irradiation location of the laser may include changing an irradiation location of the laser by changing a location of the adjustment unit.

Herein, the changing of the irradiation location of the laser may include moving a location of the adjustment unit by a distance corresponding to the offset value of the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
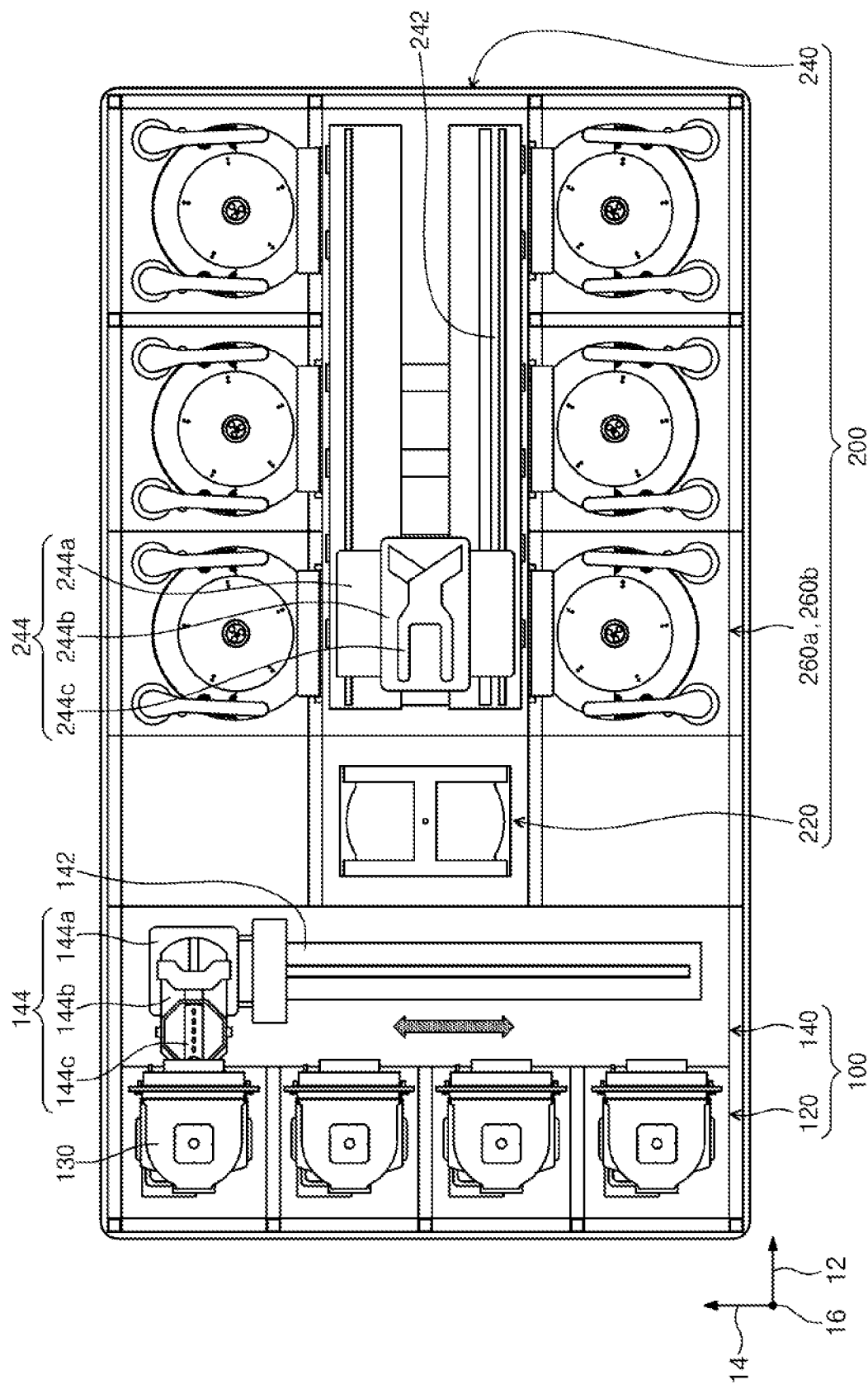
FIG. 1 is a plan view of a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof. The terms of a singular form may include plural forms unless otherwise specified. Furthermore, in the drawings, the shapes and dimensions of components may be exaggerated for clarity of illustration.

FIG. 1 is a plan view of a substrate treating apparatus according to an embodiment of the inventive concept. Referring to FIG. 1, a substrate treating apparatus 10 includes an index module 100 and a process module 200. The index module 100 includes a load port 120 and a transfer frame 140. The load port 120, the transfer frame 140, and the process module 200 may be arranged in a row. Hereinafter, a direction where the load port 120, the transfer frame 140, and the process module 200 are arranged may be referred to as "first direction" 12. When viewed from above the top, a direction perpendicular to the first direction 12 may be referred to as "second direction" 14, and a direction perpendicular to a plane defined by the first direction 12 and the second direction 14 may be referred to as "third direction" 16.

A carrier 130 where a substrate W is received may be placed on the load port 120. The load ports 120 are arranged in a row along the second direction 14. The number of load ports 120 may increase or decrease depending on conditions such as process efficiency, footprint, and the like in the process module 200. A plurality of slots (not illustrated) for receiving the substrates W in a state where the substrates W are placed in a horizontal position on the ground surface are formed in the carrier 130. A Front Opening Unified Pod (FOUP) may be used as the carrier 130.

The process module 200 has a buffer unit 220, a transfer chamber 240, and a process chamber 260a or 260b. The transfer chamber 240 is arranged such that the length direction thereof is parallel to the first direction 12. The process chambers 260a and 260b are arranged on both sides of the transfer chamber 240, respectively. The process chambers 260a and 260b are provided at one side and the other side of the transfer chamber 240 to be symmetrical with respect to the transfer chamber 240. The plurality of process chambers 260a and 260b are provided at one side of the transfer chamber 240. A part of the process chambers 260a and 260b is arranged along a length direction of the transfer chamber 240. Furthermore, the part of the process chambers 260a and 260b is arranged to be stacked. That is, the process chambers 260a and 260b may be arranged in the array of 'A×B' at the one side of the transfer chamber 240. Herein, 'A' refers to the number of process chambers 260a and 260b provided in a row along the first direction 12; 'B' refers to the number of process chambers 260a and 260b provided in a row along the third direction 16. When four or six process chambers 260a and 260b are provided at one side of the transfer chamber 240, the process chambers 260a and 260b may be arranged in the array of '2×2' or '3×2'. The number of process chambers 260a and 260b may increase or decrease. Unlike the above description, the process chambers 260a and 260b may be provided at only the one side of the transfer chamber 240. In addition, the process chambers 260a and 260b may be provided as a single layer at one side and both sides of the transfer chamber 240.

The buffer unit 220 is interposed between the transfer frame 140 and the transfer chamber 240. The buffer unit 220 provides a space in which the substrate W stays before transferred between the transfer chamber 240 and the transfer frame 140. A slot (not illustrated) where the substrate W is placed is provided inside the buffer unit 220. A plurality of slots may be provided to be spaced from each other along the third direction 16. The buffer unit 220 may have an opened surface facing the transfer frame 140 and an opened surface facing the transfer chamber 240.

The transfer frame 140 transfers the substrate W between the buffer unit 220 and the carrier 130 placed on the load port 120. The transfer frame 140 includes an index rail 142 and an index robot 144. The index rail 142 is arranged such that the length direction thereof is parallel to the second direction 14. The index robot 144 is installed on the index rail 142 and rectilinearly moves in the second direction 14 along the index rail 142. The index robot 144 may have a base 144a, a body 144b, and an index arm 144c. The base 144a may be installed to be movable along the index rail 142. The body 144b is coupled to the base 144a. The body 144b is provided to be movable on the base 144a along the third direction 16. Furthermore, the body 144b is provided to be rotatable on the base 144a. The index arm 144c is coupled to the body 144b and is movable forward and backward relative to the body 144b. The plurality of index arms 144c may be provided; the plurality of index arms 144c may individually operate. The index arms 144c are arranged to be stacked along the third direction 16 in a state where the index arms 144c are spaced from one another. Some of the index arms 144c may be used to transfer the substrate W from the process module 200 to the carrier 130, and the other index arms 144c may be used to transfer the substrate W from the carrier 130 to the process module 200. Accordingly, It is possible to prevent particles generated from the substrate W before the process treatment from adhering to the substrate W after the process treatment in a process in which the index robot 144 transfers and receives the substrate W.

The transfer chamber 240 transfers the substrate W between the buffer unit 220 and the process chambers 260a and 260b and between the process chambers 260a and 260b. A guide rail 242 and a main robot 244 may be provided in the transfer chamber 240. The guide rail 242 is arranged such that the length direction thereof is parallel to the first direction 12. The main robot 244 is installed on the guide rail 242 and rectilinearly moves on the guide rail 242 along the first direction 12. The main robot 244 may have a base 244a, a body 244b, and a main arm 244c. The base 244a is installed to be movable along the guide rail 242. The body 244b is coupled to the base 244a. The body 244b is provided to be movable on the base 244a along the third direction 16. Furthermore, the body 244b is provided to be rotatable on the base 244a. The main arm 244c is coupled to the body 244b and is movable forward and backward relative to the body 244b. The plurality of main arms 244c may be provided; and the plurality of main arms 244c may individually operate. The main arms 244c are arranged to be stacked along the third direction 16 in a state where the main arms 244c are spaced from one another.

The process chambers 260a and 260b may include the cleaning treating chamber 260a and the edge treating chamber 260b. The cleaning treating chamber 260a may perform cleaning process on the substrate W. The cleaning treating chamber 260a may perform a cleaning process by supplying cleaning solution to the central region of the rotating substrate W. The cleaning treating chamber 260a may have a different structure depending on a type. Instead, the cleaning treating chamber 260a may have the same structure. Optionally, the cleaning treating chamber 260a may be divided into a plurality of groups, and the cleaning treating chambers 260a belonging to the same group may have the same structure; the cleaning treating chambers 260a belonging to different groups may have different structures.

The edge treating chamber 260b may treat the edge region of the substrate W. The edge treating chamber 260b may have a different structure depending on a type. Instead, the edge treating chamber 260b may have the same structure. Optionally, the edge treating chamber 260b may be divided into a plurality of groups, and the edge treating chamber 260b belonging to the same group may have the same structure; the edge treating chamber 260b belonging to different groups may have different structures. A substrate treating apparatus 300 performing a treatment process on the edge region of the substrate W is provided in the edge treating chamber 260b.

Figure 2:
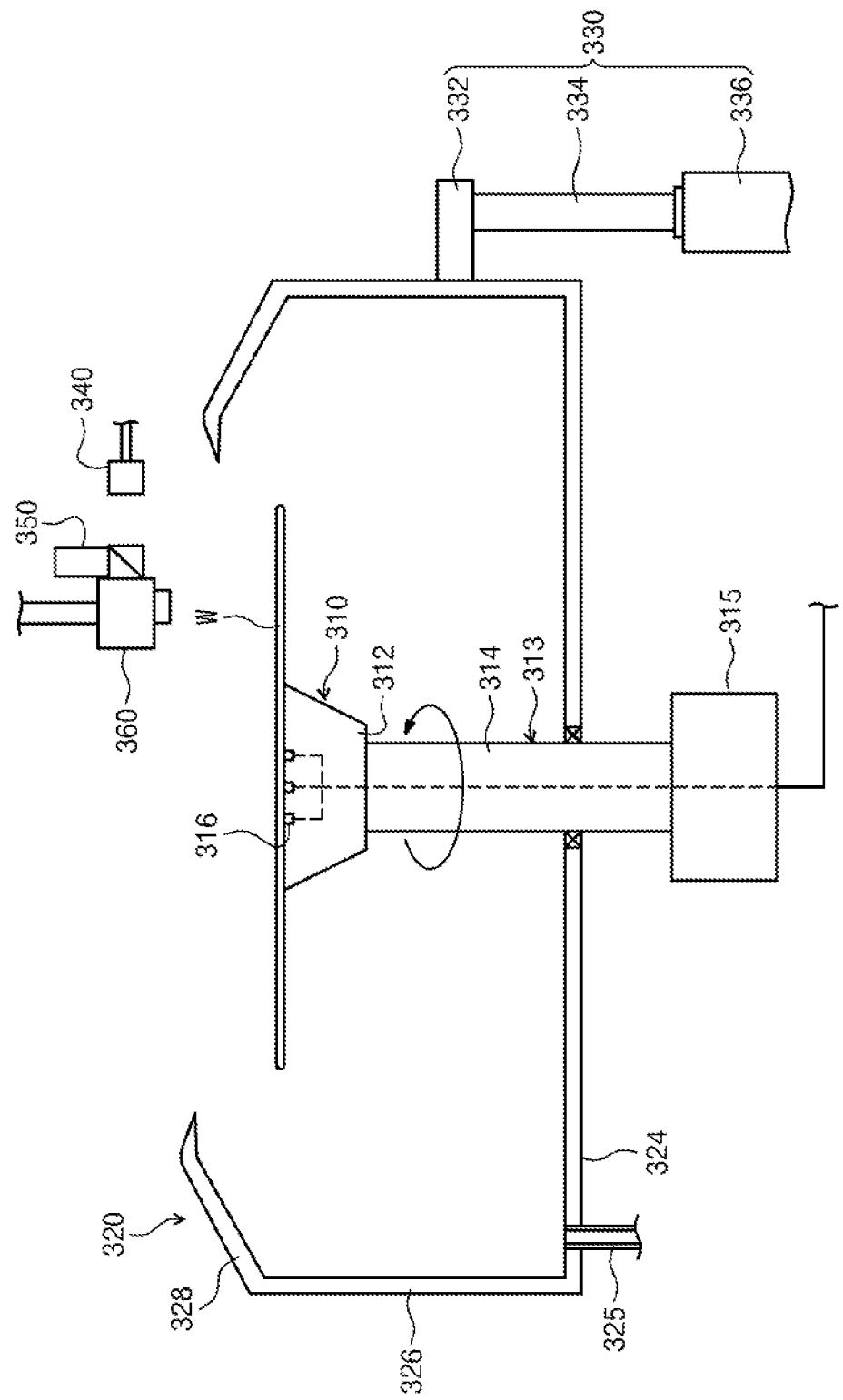
FIG. 2 is a cross-sectional view illustrating a substrate treating apparatus according to an embodiment of the inventive concept.

FIG. 2 is a cross-sectional view illustrating a substrate treating apparatus according to an embodiment of the inventive concept. Referring to FIG. 2, the substrate treating apparatus 300 may include a support unit 310, a treating container 320, a lifting unit 330, a laser unit 340, a vision unit 350, an adjustment unit 360, and a drain unit 400.

The support unit 310 supports and rotates the substrate W. The support unit 310 includes a support plate 312 and a rotational driving member 313. The support plate 312 supports the substrate W. The support plate 312 may be provided to have the shape of a circular plate. The support plate 312 may have a smaller diameter than the substrate W. An absorption hole 316 is formed on the support surface of the support plate 312, and negative pressure may be provided to an absorption hole 316. The substrate W may be adsorbed to the support surface by the negative pressure.

The rotational driving member 313 rotates the support plate 312. For example, the rotational driving member 313 may be provided as a spin head. The rotational driving member 313 includes a rotational shaft 314 and an actuator 315. The rotational shaft 314 is provided such that the length direction thereof has a cylindrical shape facing in the vertical direction. The rotational shaft 314 is coupled to the bottom surface of the support plate 312. The actuator 315 transmits the rotational force to the rotational shaft 314. The rotational shaft 314 is rotatable about the central axis by the rotational force provided from the actuator 315. The support plate 312 is rotatable together with the rotational shaft 314. The rotational speed of the rotational shaft 314 is adjusted by the actuator 315, and thus the rotational shaft 314 is capable of adjusting the rotational speed of the substrate W. For example, the actuator 315 may be a motor.

The treating container 320 provides a treatment space 322 therein. The treating container 320 is provided to have the shape of an opened cup. The treating container 320 may be provided to surround the support unit 310. The treating container 320 includes a bottom surface part 324, a side part 326, and a top surface part 328. The bottom surface part 324 is provided in the shape of a hollow disc.

A recovery line 325 is formed on the bottom surface part 324. The recovery line 325 may provide the treatment solution recovered through the treatment space 322 to an external liquid regeneration system (not illustrated). The side part 326 is provided in a hollow cylindrical shape. The side part 326 extends in a vertical direction from one side end of the bottom surface part 324. The side part 326 extends upward from the bottom surface part 324. The top surface part 328 extends from the top end of the side part 326. The top surface part 328 faces the upwardly inclined direction as approaching the support unit 310.

The lifting unit 330 adjusts the relative height between the support unit 310 and the treating container 320. The lifting unit 330 vertically moves the treating container 320. The lifting unit 330 may include a bracket 332, a moving shaft 334, and a driving member 336. The driving member 336 may be a motor. The bracket 332 is fixedly coupled to the side part 326 of the treating container 320. The moving shaft 334 supports the bracket 332. The moving shaft 334 is provided such that the length direction thereof faces the vertical direction. The driving member 336 vertically moves the moving shaft 334. Accordingly, the bracket 332 and the treating container 320 are movable vertically.

Figure 3:
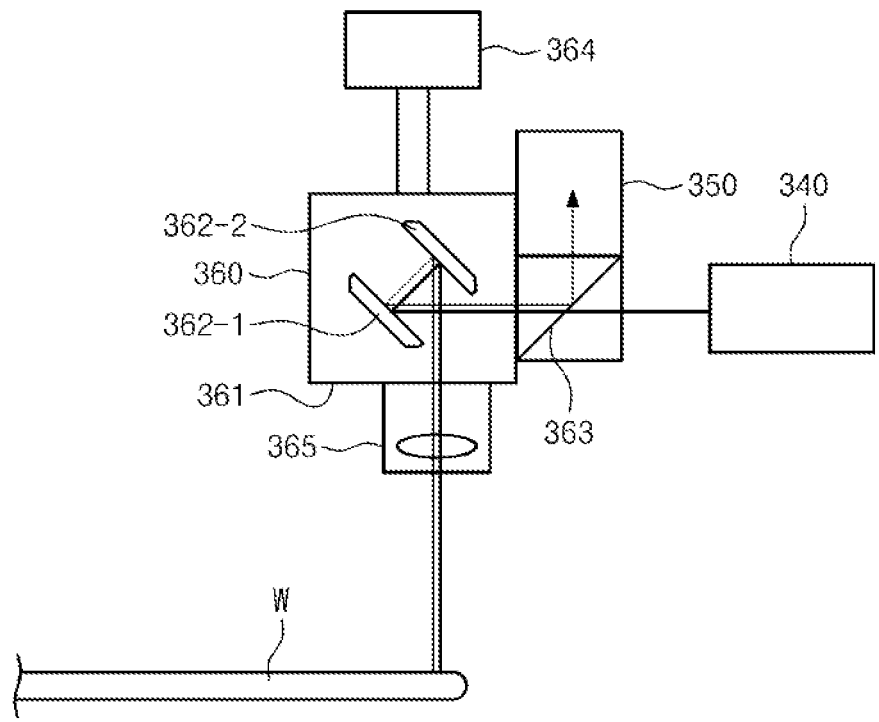
FIG. 3 is a cross-sectional view illustrating a configuration of a laser unit, vision unit, and an adjustment unit according to an embodiment of the inventive concept.

The laser unit 340 irradiates laser to the edge region of a substrate. The vision unit 350 measures the offset value of the substrate by capturing the edge region of the substrate. The adjustment unit 360 may adjust the irradiation location of the laser based on the offset value of the substrate measured by the vision unit 350. Referring to FIG. 3, the adjustment unit 360 may include a body 361, a light reflection unit 362, a light splitter 363, a controller 364, and a lighting unit 365. The light reflection unit 362 is provided inside the body 361 to coaxially change the irradiation direction of the laser irradiated from the laser unit 340 and the imaging direction of the vision unit 350. The plurality of light reflection units 362 may be provided to precisely control the irradiation direction of the laser. The light splitter 363 may transmit the light of a specific wavelength and may reflect the light of another wavelength. For example, the light splitter 363 may transmit the laser irradiated from the laser unit 340 and may provide the laser to the light reflection unit 362; the light splitter 363 may reflect the reflected light of the edge region of the substrate and may provide the reflected light to the vision unit 350. The lighting unit 365 is provided under the body 361 to irradiate light to the edge region of the substrate. The vision unit 350 may receive the reflected light reflected from the substrate by the light irradiated from the lighting unit 365 to capture the edge region of the substrate. The lighting unit 365 may be provided as a light emitting diode (LED), but is not limited thereto. For example, a lens for integrating light at the center may be arranged at the center of the lighting unit 365 and a plurality of LEDs may be arranged around the lens. The controller 364 drives the body 361 to adjust the irradiation location of the laser. The controller 364 may change the slope of the body 361 or may move the location of the body 361. In addition, the controller 364 may adjust the light reflection unit 362 to adjust the irradiation location of the laser. Hereinafter, a method in which the adjustment unit 360 of the inventive concept adjusts the irradiation location of the laser will be described in detail with reference to FIGS. 4 to 8.

Figure 4:
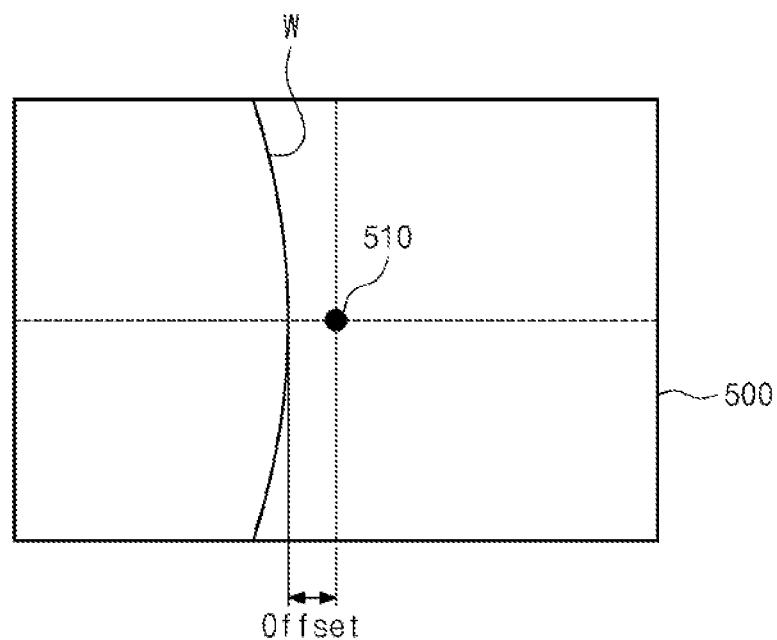
FIG. 4 is a view illustrating an example of an image captured by a vision unit according to an embodiment of the inventive concept.
Figure 5:
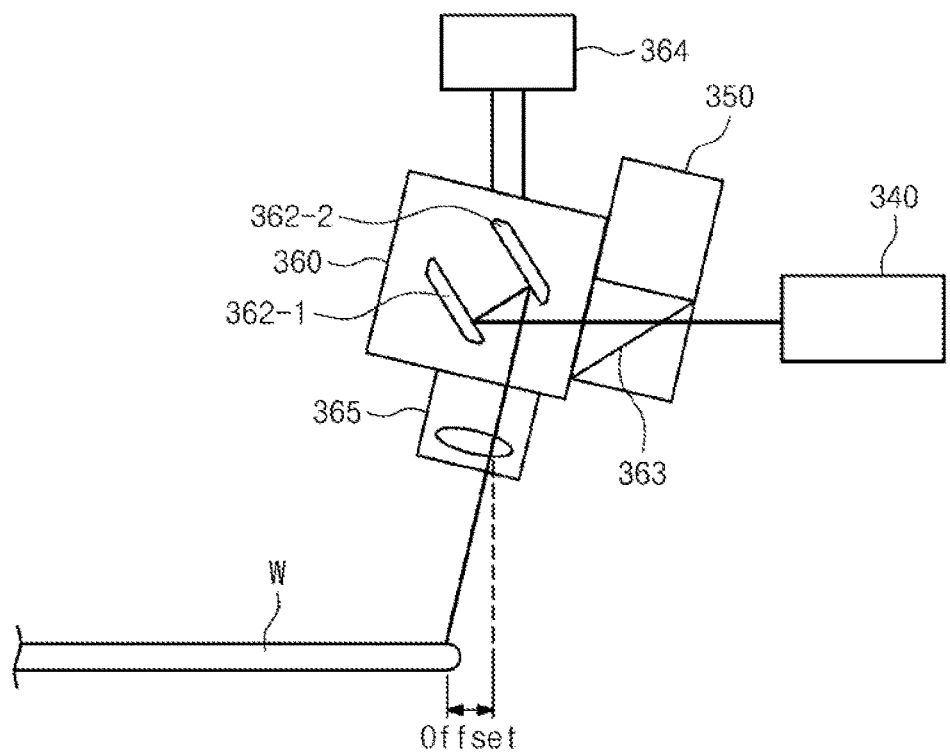
FIGS. 5 to 7 are views for describing a method of changing an irradiation location of laser by adjusting a slope of a body according to an embodiment of the inventive concept.
Figure 6:
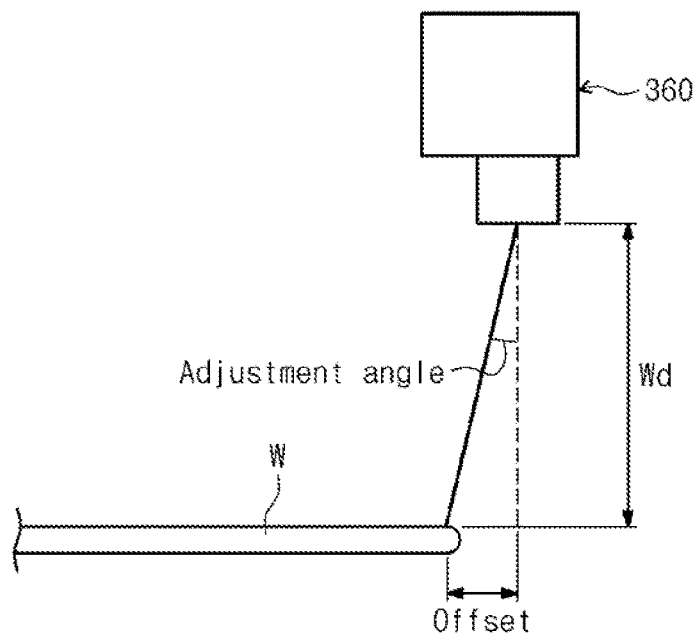
Figure 7:
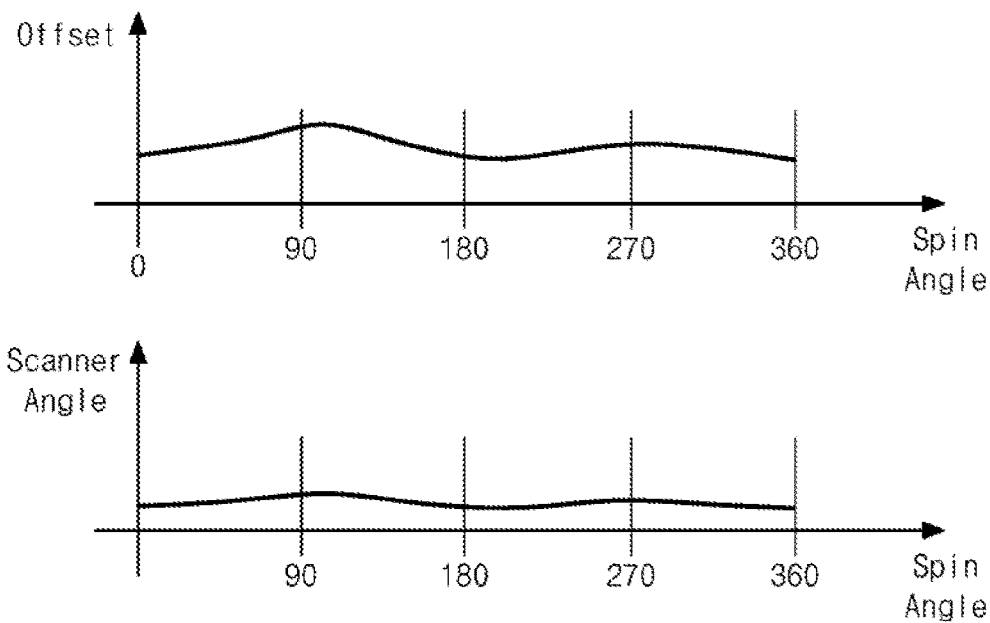
Figure 8:
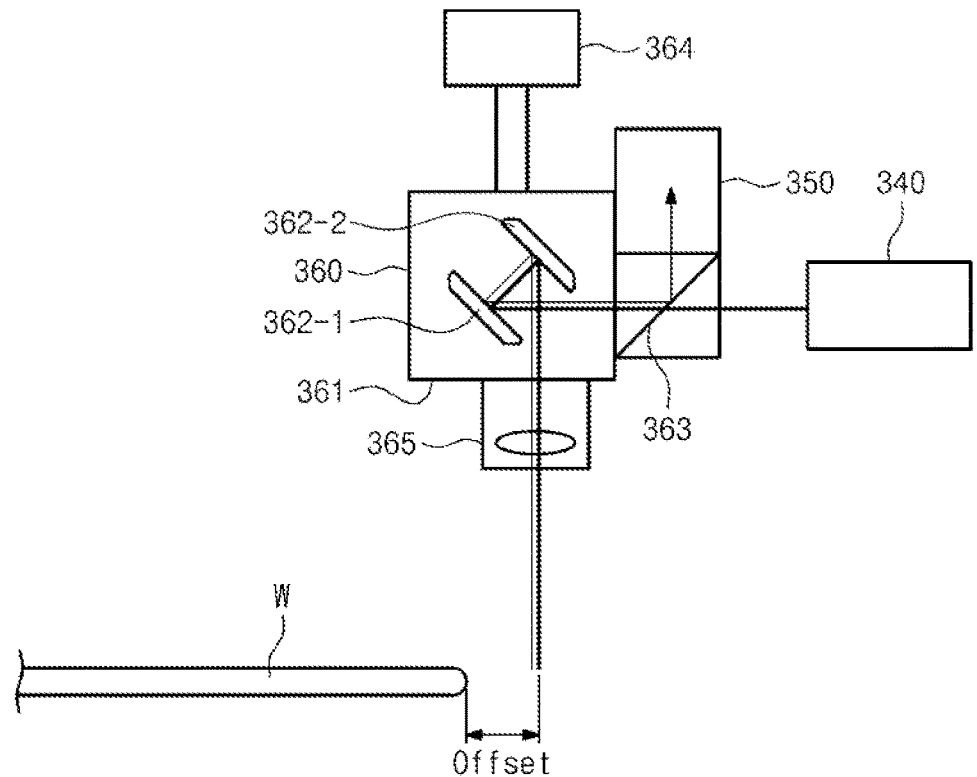
FIG. 8 is a view for describing a method of changing an irradiation location of laser by changing a location of a body according to an embodiment of the inventive concept.

Referring to FIG. 4, the vision unit 350 may obtain an image 500 by capturing the edge region of a substrate and may calculate the offset value of the substrate by measuring the distance between the end of the substrate and the predetermined reference point 510. Herein, the reference point 510 may be a central point of the image 500, and the offset value may be the shortest distance between the end of the substrate and the reference point 510. When the offset value of the substrate is obtained, as illustrated in FIG. 5, the controller 364 may change the irradiation location of the laser by adjusting the slope of the body 361. At this time, the slope of the body 361 may be calculated using the offset value of the substrate and the distance Wd between the substrate and the adjustment unit 360. That is, as illustrated in FIG. 6, because the slope of the body 361 is the inner angle of a right triangle with the distance Wd between the substrate and the adjustment unit 360 as the base and with the offset value of the substrate as the height, the slope of the body 361 may be calculated using a trigonometric function. The vision unit 350 may obtain the offset value of the substrate in all edge regions of the substrate by capturing the edge region of the substrate depending on the rotation of the substrate. In addition, the slope of the body 361 in all edge regions of the substrate may be calculated using the obtained offset value of the substrate and the obtained distance Wd between the substrate and the adjustment unit 360. For example, as illustrated in FIG. 7, the slope of the body 361 and the offset value of the substrate according to the spin angle of the substrate may be calculated. That is, after obtaining the offset value of the substrate in all edge regions of the substrate, the inventive concept may perform a precise etching process on the edge region of the substrate by calculating the slope of the body 361 corresponding to the offset value of the obtained substrate. In addition, the adjustment unit 360 may be synchronously controlled together with the spin head 313 based on the offset value of the substrate; the adjustment unit 360 may generate a profile for the offset value of the substrate corresponding to the spin angle of the substrate and may adjust the irradiation location of the laser depending on the generated profile. Moreover, as illustrated in FIG. 8, when the offset value of the substrate is obtained by the vision unit 350, the adjustment unit 360 may change the laser irradiation location by moving the body 361 by a distance corresponding to the offset value of the substrate.

Figure 9:
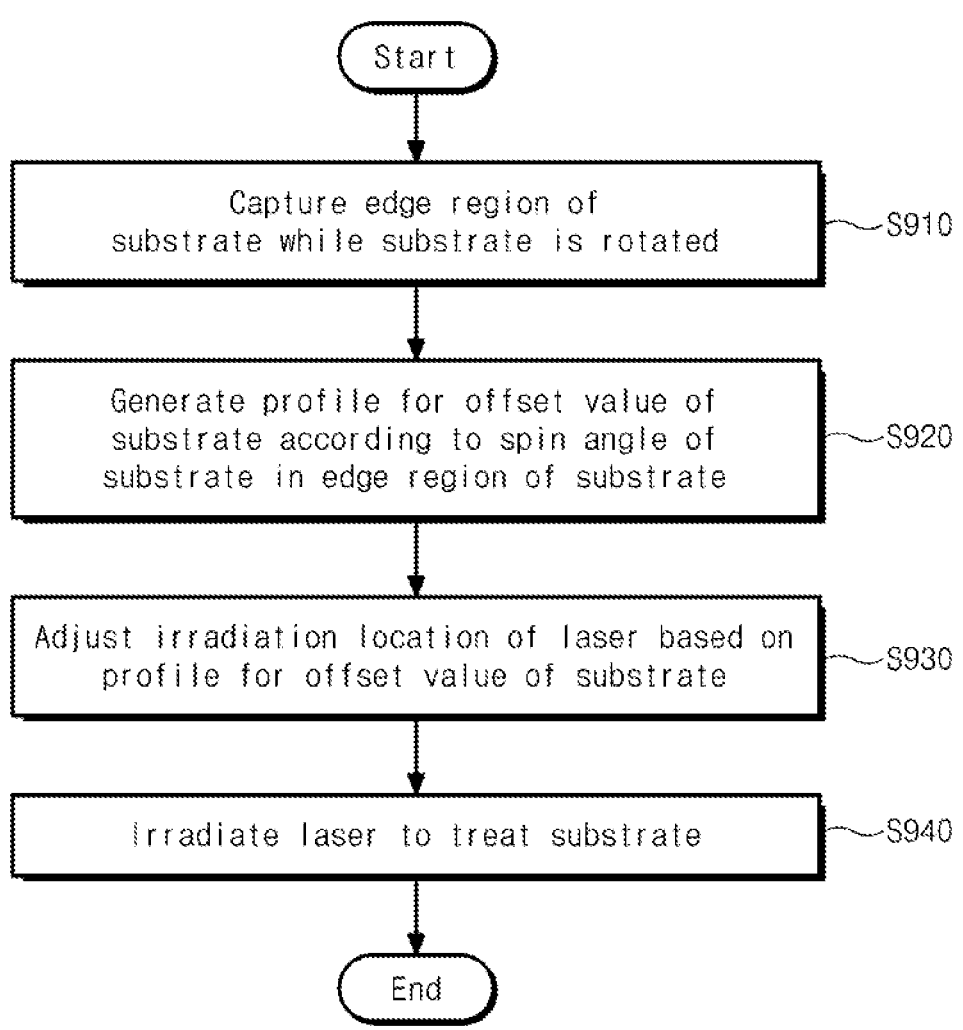
FIG. 9 is a flowchart illustrating a substrate treating method according to an embodiment of the inventive concept.

FIG. 9 is a flowchart illustrating a substrate treating method according to an embodiment of the inventive concept.

Referring to FIG. 9, above all, in S910, the edge region of the substrate is captured while the substrate is rotated. Next, in S920, a profile for the offset value of the substrate according to the spin angle of the substrate in the edge region of the substrate is generated. In particular, the shortest distance between a predetermined reference point and the end of the substrate may be calculated as the offset value of the substrate in the image captured by the vision unit.

Next, in S930, the irradiation location of laser is adjusted based on the profile for the offset value of the substrate. For example, the irradiation location of the laser may be changed by adjusting the slope of the adjustment unit. In this case, the slope of the adjustment unit may be calculated based on the offset value of the substrate and the distance between the adjustment unit and the substrate. For another example, the irradiation location of the laser may be changed by changing the location of the adjustment unit. In this case, the irradiation location of the laser may be changed by moving the location of the adjustment unit by a distance corresponding to the offset value of the substrate.

Next, in S940, the substrate is processed by irradiating laser.

According to an embodiment of the inventive concept, the offset value of the substrate is measured and the irradiation location of laser is adjusted based on the measured offset value, thereby reducing the treatment time of the etching process. In addition, even when the diameter difference of a substrate occurs, the accuracy of the etching process may be improved.

According to an embodiment of the inventive concept, the eccentricity of the substrate is measured and the irradiation location of laser is adjusted based on the measured eccentricity, thereby reducing the treatment time of the etching process. In addition, even when the diameter difference of a substrate occurs, the accuracy of the etching process may be improved.

Effects of the inventive concept are not limited to the above-described effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A substrate treating apparatus comprising:
    a chamber configured to provide a space in which a substrate is treated;
    a support unit configured to support the substrate inside the chamber;
    a laser unit configured to irradiate laser to an edge region of the substrate;
    a vision unit configured to capture the edge region of the substrate to measure an offset value of the substrate; and an adjustment unit including a body that is configured to rotate to adjust an irradiation location of the laser based on the offset value of the substrate, wherein the adjustment unit generates a profile for the offset value corresponding to a spin angle of the substrate and adjusts the irradiation location of the laser based on the profile with respect to a slope of the body that is calculated using the offset value and a distance between the substrate and the adjustment unit.

2. The substrate treating apparatus of claim 1, wherein the adjustment unit further includes:

a light reflection unit provided inside the body and configured to coaxially change an irradiation direction of the laser and an imaging direction of the vision unit; and a controller configured to adjust the irradiation location of the laser by driving the body.

3. The substrate treating apparatus of claim 2, wherein the controller changes the irradiation location of the laser by adjusting the slope of the body.

4. The substrate treating apparatus of claim 3, wherein the controller calculates a shortest distance between a predetermined reference point and an end of the substrate as the offset value of the substrate in an image captured by the vision unit and adjusts the slope of the body based on the offset value and the distance between the body and the substrate.

5. The substrate treating apparatus of claim 2, wherein the controller changes the irradiation location of the laser by changing a location of the body.

6. The substrate treating apparatus of claim 5, wherein the controller moves the location of the body by a distance corresponding to the offset value of the substrate.

7. The substrate treating apparatus of claim 4, wherein the support unit includes a spin head for rotating the substrate, and wherein the adjustment unit is synchronously controlled together with the spin head based on the offset value of the substrate.

* * * * *